(12) United States Patent
Siomkos et al.

(10) Patent No.: US 6,184,751 B1
(45) Date of Patent: Feb. 6, 2001

(54) AMPLIFIER CIRCUIT

(75) Inventors: John Robert Siomkos, Royal Palm Beach; Edgar Herbert Callaway, Jr., Boca Raton, both of FL (US)

(73) Assignee: Motorola, Inc., Schaumburg, IL (US)

( * ) Notice: Under 35 U.S.C. 154(b), the term of this patent shall be extended for 0 days.

(21) Appl. No.: 09/135,441

(22) Filed: Aug. 17, 1998

(51) Int. Cl.[7] ................. H03G 3/18; H04B 1/06

(52) U.S. Cl. ............... 330/278; 330/51; 330/126; 455/241.1; 455/246.1; 455/253.2

(58) Field of Search .................. 330/51, 126, 278–285; 455/241.1, 246.1, 253.1, 253.2

(56) References Cited

U.S. PATENT DOCUMENTS 2,737,628 * 3/1956 Haines ................................. 330/126
4,757,276 * 7/1988 Ishii et al. ............................ 330/278

* cited by examiner

Primary Examiner—Michael B Shingleton
(74) Attorney, Agent, or Firm—Randi L. Dulaney

(57) ABSTRACT

An amplifier circuit (20) uses a series transistor (38) to couple the output of an amplifier (26) to a tuned circuit load (40) and to act as a variable resistance. In one embodiment for a multi-band receiver, multiple series transistors (38, 42) are switched for connecting different tuned circuits (40, 44) to the amplifier's output, and an activated one of the series transistors receives a gate voltage that varies its resistance so as to achieve gain control. An activated series transistors can also provide a resistance that stabilizes the amplifier (26).

7 Claims, 3 Drawing Sheets

AMPLIFIER CIRCUIT

FIELD OF THE INVENTION

This invention is generally directed to amplifier circuits, and particularly to amplifier circuits that may include AGC (Automatic Gain Control).

BACKGROUND OF THE INVENTION

Various kinds of radio receivers include an RF amplifier, the gain of which can be automatically reduced under strong signal conditions by the use of AGC. Without such AGC, circuitry receiving the output of the RF amplifier can become overloaded, resulting in poor inter-modulation performance and other undesirable results.

A conventional RF amplifier 10 with AGC is shown in FIG. 1. Transistors 12 and 14 are interconnected as a cascode amplifier, with the transistor 12 receiving an RF input signal to be amplified, and an amplified output signal being developed across a tuned circuit 15. An AGC signal is coupled via an RC network 16 to the base of transistor 14. As the AGC signal goes low, the collector-emitter voltage of transistor 12 is reduced. This causes the transistor 12 to begin to saturate, thereby reducing the amplifier's gain and the amplitude of the output signal. With this technique, the output of the RF amplifier can be held at a relatively constant level over a wide range of input signal levels. However, changing the amplifier's gain over a wide range does not provide the desired linearity.

The RF amplifier 10 is designed to be used with a single RF frequency band, with the tuned circuit 15 being tuned to the desired band. Multi-band receivers generally require multiple tuned circuits, one for each frequency band to be received, plus switching devices to select the proper tuned circuit for the frequency band to be received. AGC is also preferably provided for all frequency bands, but including AGC control as shown in FIG. 1, in addition to the switching devices needed to select the proper tuned circuit, can lead to duplication of circuitry and an undesirably large number of components. The problem of reduced linearity also remains.

DESCRIPTION OF THE PREFERRED EMBODIMENT

Figure 1:
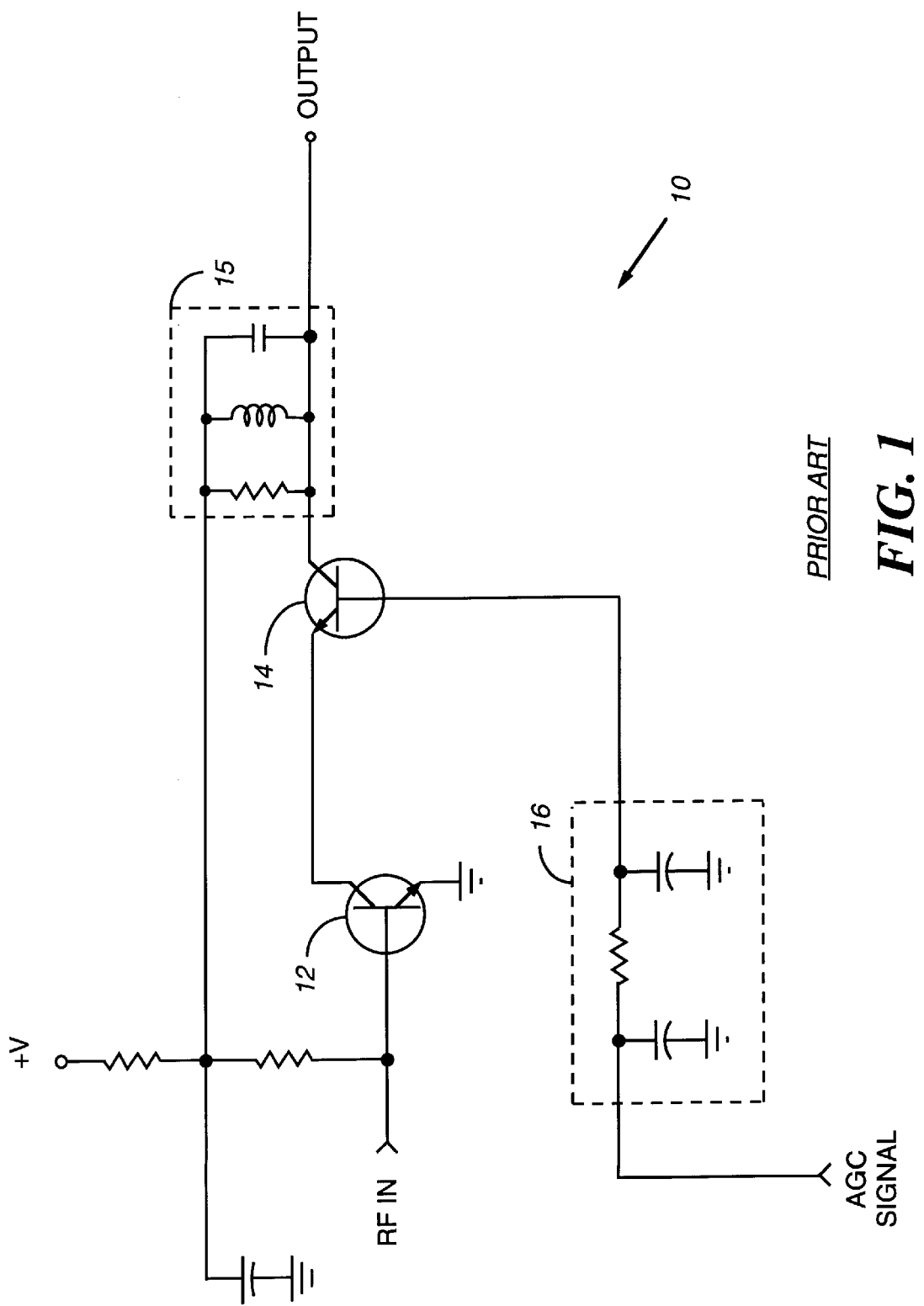
FIG. 1 is a circuit diagram of a conventional gain controlled amplifier circuit for use in a single band receiver.
Figure 2:
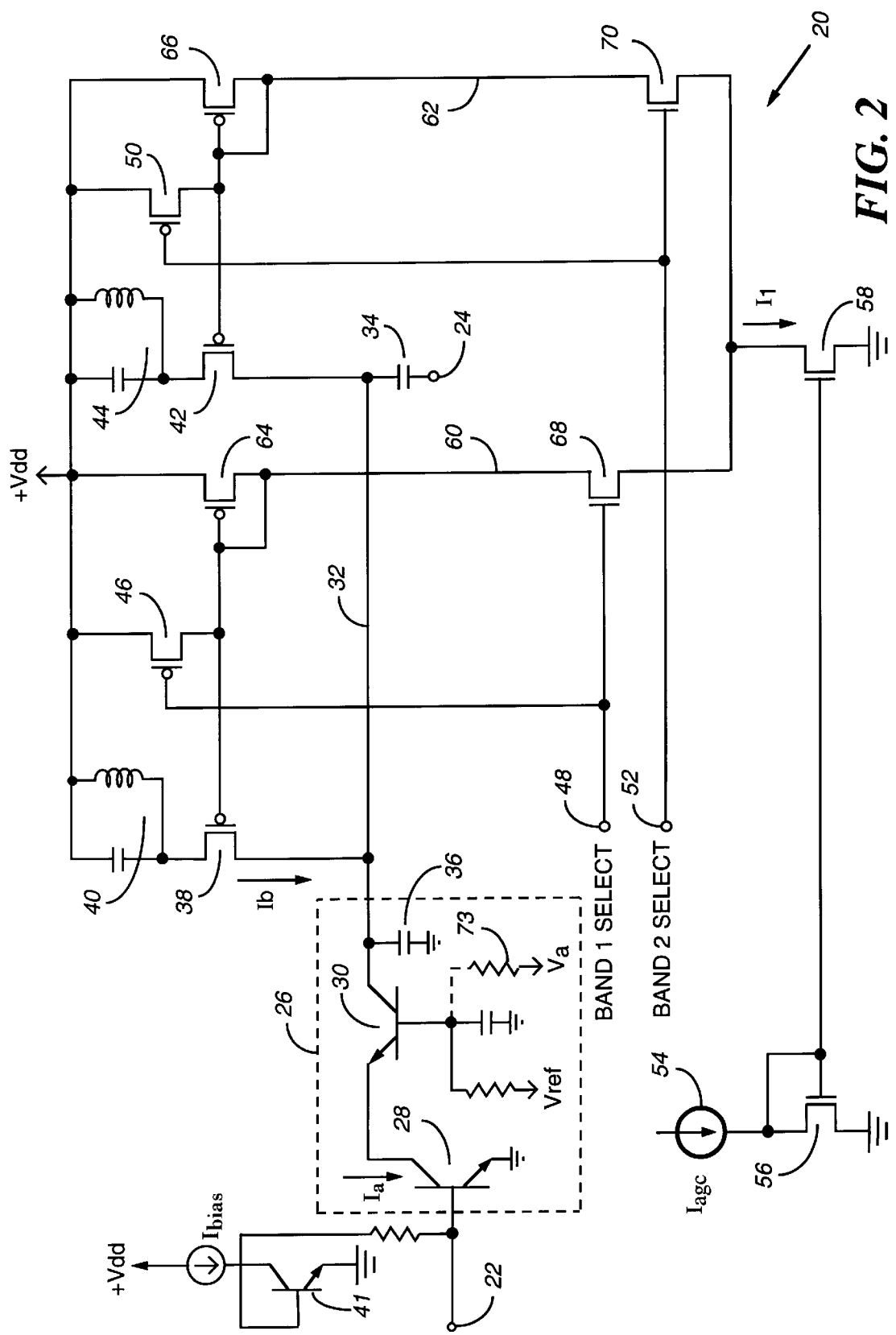
FIG. 2 is a circuit diagram of a gain controlled amplifier circuit according to the invention for use in a multi-band receiver.

Referring to FIG. 2, a gain controlled amplifier circuit 20, constructed with conventional bipolar and MOS (Metal Oxide Semiconductor) devices, provides a wide range of gain control without an accompanying reduction in linearity. Further, the amplifier circuit 20 is well suited for use in multi-band receivers with a minimum number of extra components.

An RF signal input to the amplifier circuit 20 is at an input port 22. An amplified and gain-controlled output signal is taken at an output port 24.

An amplifier 26, comprising bipolar transistors 28 and 30 interconnected as a cascode amplifier, receives and amplifies the input signal. (The transistors 28 and 30 may also be MOS devices.) The output of the amplifier 26 is coupled to the output port 24 via lead 32 and a coupling capacitor 34. A parasitic capacitance 36 exists at the output of the amplifier 26.

The illustrated amplifier circuit 20 is constructed to operate in a receiver that receives two bands of frequencies, referred to herein as band 1 and band 2. It will be apparent, however, that the invention can be used with more bands or fewer bands.

When operating in band 1, the amplifier 26 has a load that includes a series PMOS transistor 38 that is activated (turned on) and a tuned circuit 40 that is tuned to the frequencies associated with band 1. For operation in band 2, the series transistor 38 is turned off and the load becomes a different series PMOS transistor 42 and a tuned circuit 44 that is tuned to the frequencies associated with band 2.

Band selection circuitry for switching between band 1 and band 2 includes a PMOS transistor 46 whose drain is coupled to the gate of transistor 38, and whose gate is coupled to a band 1 select terminal 48. Another PMOS transistor 50 has a drain that is coupled to the gate of series transistor 42, and a gate that is coupled to a band 2 select terminal 52.

To select band 1 operation, a high level voltage is applied to terminal 48. This causes transistor 46 to turn off, allowing the voltage level at the gate of series transistor 38 to fall, thereby activating series transistor 38 and coupling the tuned circuit 40 to the amplifier 26 through the low resistance of the activated series transistor 38. Simultaneously, a low voltage is applied to terminal 52 to hold transistor 50 in an on condition, thereby also holding series transistor 42 in an off condition and isolating the tuned circuit 44 from the amplifier 26. When the opposite polarity voltages are applied to terminals 48 and 52, series transistor 42 is activated and series transistor 38 is turned off, thereby selecting band 2 by coupling the tuned circuit 44 to the amplifier 26 through the low resistance of activated series transistor 42.

The way in which gain control is achieved will now be described with the assumption that band 1 operation is in effect. A source of current Ibias and a transistor 41 are coupled to the base of transistor 28 in a current mirror configuration. Accordingly, the transistor 28 conducts a current Ia that substantially matches Ibias. With the series transistor 38 activated, it completes a series path between the tuned circuit 40 and the output of the amplifier 26. Consequently, a bias current Ib, which substantially matches Ia, flows from a power supply voltage Vdd, through the tuned circuit 40 and the series transistor 38. Substantially the same current, identified as Ia, flows to ground through transistors 30 and 28.

The transistor 38 acts as a resistance that can be varied by the application of a variable gate voltage, Vgs. Gain control circuitry (described later) is coupled to the gate of the transistor 38 for applying the voltage Vgs and controlling the resistance provided by series transistor 38. As the voltage Vgs on transistor 38 is increased to a turn-on (relatively high) level, the resistance of the transistor 38 becomes very low, thus essentially connecting the tuned circuit 40 to the output of the amplifier 26. This has the important effect of coupling the parasitic capacitance 36 in parallel with the tuned circuit 40 so that the parasitic capacitance acts as part of the tuned circuit 40. This substantially raises the value of the load impedance seen by the amplifier 26. Meanwhile, the transistor 30 is operating in a relatively linear mode, allowing the amplifier circuit 20 to operate at a relatively high level of gain.

When the gain control circuitry operates to reduce the gain of the amplifier, it raises the gate voltage of transistor 38 toward a turn-off value. This causes the resistance of transistor 38 to increase, and effectively places resistance between the parasitic capacitance 36 and the tuned circuit 40. This resistance becomes large enough to essentially isolate the parasitic capacitance 36 from the tuned circuit 40. Consequently, the parasitic capacitance 36, having a typical value of about 1 picofarad, shunts some of the amplifier's output signal to ground. This has the effect of lowering the load impedance of the amplifier 26. The increased resistance of transistor 38 also lowers the DC voltage on lead 32, eventually saturating transistor 30, thereby decreasing its transconductance and further lowering the gain of the amplifier circuit 20.

It is significant that the change in gate voltage for transistor 38 changes both the transconductance of the amplifier 26 and the value of its load. The voltage gain of an amplifier equals gm×RL, where gm is the amplifier's transconductance and RL is its load resistance. In this case, the changing gate voltage of transistor 38 causes a change in gm in amplifier 26 and a change in RL. Both of these changes lower the gain of the amplifier 26. Consequently, it is possible to effect a relatively large amount of gain change without a significant change in the amplifier's bias current. This results in a relatively small change in the amplifier's linearity.

Gain control during band 2 operation is the same as described above except that it is the resistance of series transistor 42 that is changed. As the gate voltage of transistor 42 is raised, its resistance increases, resulting in parasitic capacitance 36 being isolated from tuned circuit 44, and the voltage drop across transistor 42 causing the voltage on lead 32 to drop, thereby driving transistor 30 into saturation.

A current source 54 provides a control current that controls the resistance of transistors 38 and 42. When the amplifier circuit is used in its preferred gain controlled mode, the control current is an AGC current, as indicated in FIG. 2. As described later, however, the amplifier circuit 20 may be used in a mode where its gain is not controlled by AGC, and the source 54 supplies a control current that need not be in the form of an AGC current.

Assuming again that the amplifier circuit 20 is to be operated in a gain controlled mode, its gain control circuitry includes the current source 54 and current mirror circuitry that includes transistors 56 and 58, a first interruptable current path 60, a second interruptable current path 62, and transistors 64 and 66 that are coupled in a current mirror configuration with series transistors 38 and 42.

In operation, the current supplied by the AGC current source 54 flows through the transistor 56 which is connected to transistor 58 in a conventional current mirror arrangement. Thus, the transistor 58 conducts a current I1 that tracks with the AGC current.

The current I1 is conducted to current path 60 or to current path 62, depending on whether band 1 or band 2 is selected. If band 1 is selected, the voltage at terminal 48 turns on a transistor 68 that is situated in the current path 60, thus allowing the current I1 to flow in current path 60. At the same time, a low voltage at terminal 52 turns off a transistor 70 that is situated in the current path 62, thereby interrupting current path 62 and causing all of the current I1 to flow in path 60.

The current in path 60 flows through a transistor 64 that is connected in a current mirror configuration with the series transistor 38, but the current (Ib) in transistor 38 remains substantially equal to Ia. Consequently, this results in a difference between Ib and the current in path 60. This current difference forces the voltage on lead 32 to change. This voltage change changes the Vds (drain-to-source voltage) of transistor 38 in such a way as to make Ib substantially equal to Ia. Thus, changes in the amplitude of the current I1 are converted to Vds and Vgs changes at transistor 38.

When band 2 is selected, transistors 42, 66 and 70 are activated, and transistor 50 is turned off, causing the current I1 to flow in path 62. Changes in the current I1 are converted to Vds and Vgs changes at the transistor 42. As described earlier, these voltage changes result in changing the resistance of the activated series transistor (38 or 42), thereby changing the load seen by the amplifier 26 and the transconductance of amplifier 26.

It can be seen, therefore, that the amplifier circuit 20 uses the series transistors 38, 42 in two ways. In one way, the series transistors act as switches to couple the correct tuned circuit to the amplifier 26. The series transistors also act as variable resistances which vary the voltage gain of the amplifier 26. Hence, the number of components needed to provide both functions is held to a minimum. Further, the amplifier circuit 20 provides good linearity because its bias current does not change substantially over a relatively wide range of gain control.

A way of providing additional, optional gain change for the amplifier 26 is to drive the transistor 28 into saturation so that transistors 28 and 30 go into saturation together, but independently of each other. One way of accomplishing this is shown in FIG. 2 wherein a resistor 73 may couple a variable voltage Va to the base of the transistor 30. Va is adjusted such that the collector voltage of transistor 28 is reduced sufficiently to drive transistor 28 into saturation. This preferably occurs when the transistor 30 also goes into saturation, thereby providing additional gain reduction.

In addition to the advantages provided by the dual use of the series transistors as described above, the series transistors can also be used to provide the resistance that may be needed to stabilize (prevent oscillations in) the amplifier. In this manner, the component count can be reduced further. This form of stabilization is realized by limiting the resistance of the activated series transistor (38 or 42) to certain minimum values. Because the resistance of the activated series transistor is in series with the selected tuned circuit (40 or 44) and the output of the amplifier 26, the amplifier is stabilized without the conventional need for an extra discrete resistor between the amplifier 26 and its load.

Figure 3:
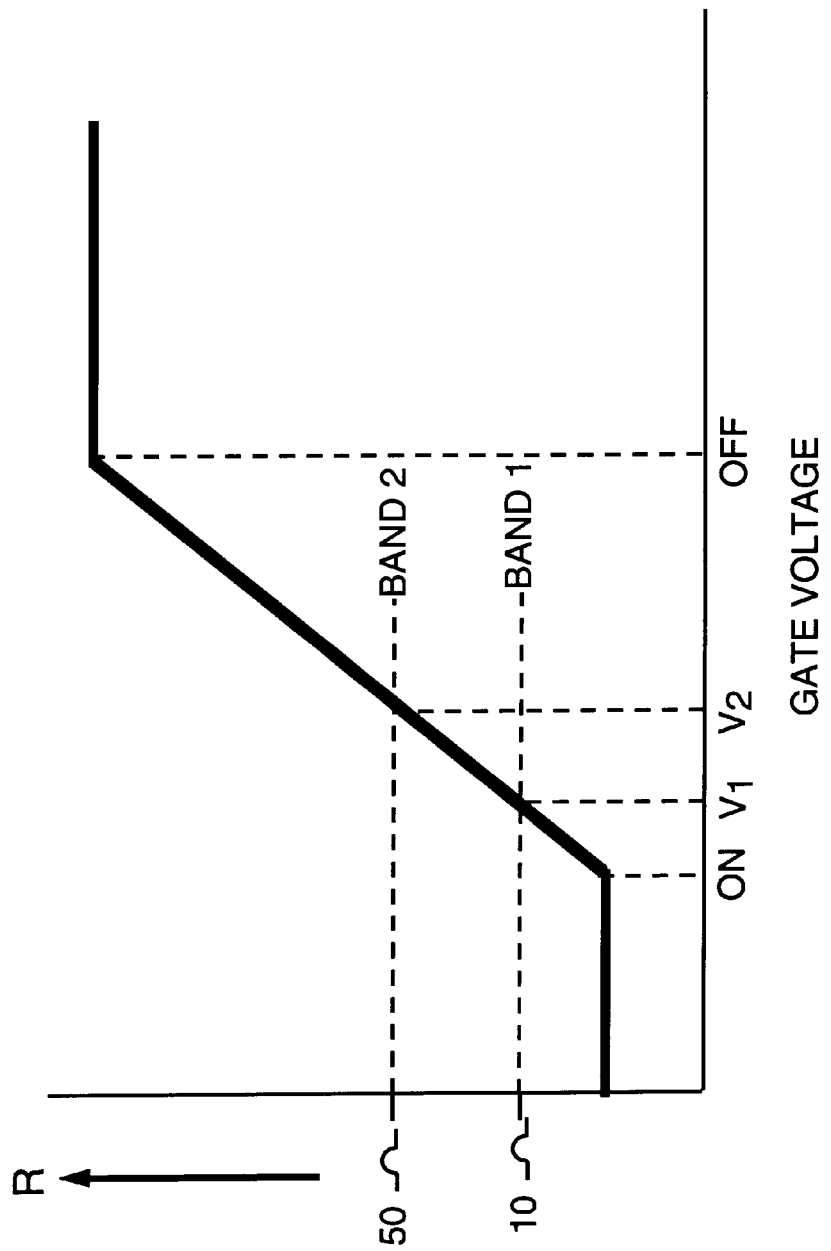
FIG. 3 is a graph showing how the resistance of the series transistors in FIG. 2 varies with current.

Referring to FIG. 3, the illustrated graph shows how the resistance of an activated series transistor (38 or 42) varies with its gate voltage. When the gate voltage is high, the series resistance R is high. As the gate voltage decreases, R decreases until it reaches a very low value. When the gate voltage is at value V1, the series resistance is about 10 ohms, and when the gate voltage is at value V2, the series resistance is about 50 ohms. Because the stability of the amplifier depends on its load, and because the load changes from band 1 to band 2, a different series resistance is selected for each band. Thus, the gate voltage may be selected to have a maximum value of V1 when band 1 is selected, thereby causing the series transistor 38 to exhibit a resistance of about 10 ohms. When band 2 is selected, the maximum value of gate voltage is selected at V2 so that series transistor 42 exhibits a resistance of about 50 ohms. Of course, these resistance values are only exemplary, and they will vary in dependence on the amplifier's design and its load.

To implement this aspect of the invention, the series transistors 38, 42 should be small MOS devices with a high length-to-width ratio so as to provide the required resistance which will depend on other well known characteristics of the devices and their loads.

The gate voltage of the activated series transistor (38 or 42) is limited to a selected maximum value by controlling the current source 54 (FIG. 2), thereby limiting the minimum value of resistance provided by the activated series transistor. If it is desired to include AGC, then the source 54 may be controlled so as to provide a maximum AGC current that results in a gate voltage of V1 (FIG. 3) when band 1 is selected, and a gate voltage of V2 when band 2 is selected.

It is not necessary to operate the amplifier circuit 20 as a gain controlled amplifier. Where it is desired to operate the amplifier circuit 20 at a substantially constant gain in a given frequency band, gate voltage may be selected to have a relatively constant value of V1 (FIG. 3) in band 1 operation, and a relatively constant value of V2 in band 2 operation. One way of achieving this result with the circuitry shown in FIG. 2 is to control the current source 54 such that it outputs a current whose value results in a voltage V1 during band 1 operation and a voltage V2 during band 2 operation. The switch from V1 to V2 can be made in response to the band select signals received by terminals 48 and 52.

Although the invention has been described in terms of a preferred embodiment, it will be obvious to those skilled in the art that various alterations and modifications may be made without departing from the invention. For example, the parasitic capacitance 36 can be replace by a discrete capacitor, or the value of capacitor 36 may be supplemented by additional capacitance. Further, the value, or supplemented value, of capacitance 36 may be used as the sole tuning capacitance for the tuned circuits 40, 44. These and all such alterations and modifications are intended to be considered as within the spirit and scope of the invention as defined by the appended claims.

What is claimed is:

1. A gain-controlled amplifier circuit for a multi-band receiver, comprising:

an amplifier having an output;

at least a first tuned circuit tuned to a first band of frequencies and a second tuned circuit tuned to a second band of frequencies;

a first series transistor coupled between the output of the amplifier and the first tuned circuit;

a second series transistor coupled between the output of the amplifier and the second tuned circuit, the first and second series transistors each having a gate and a source, and an activated one of the series transistors creating a series path of variable resistance between the output of the amplifier and a tuned circuit;

band selection circuitry coupled to the first series transistor and to the second series transistor for selectively activating one of the first and second series transistors; and gain control circuitry coupled to an activated series transistor for varying a voltage Vgs between the gate and the source of the activated series transistor so as to vary the resistance of the activated series transistor.

2. A gain-controlled amplifier circuit as set forth in claim 1 wherein the gain control circuitry includes:

a source of AGC current; and current mirror circuitry, including first and second interruptable current paths, receiving the AGC current and causing the voltage Vgs to vary in response to variations in the AGC current.

3. A gain-controlled amplifier circuit as set forth in claim 2 wherein the band selection circuitry interrupts one of the first and second interruptable current paths and completes the other current path.

4. A gain-controlled amplifier circuit as set forth in claim 1, wherein the gain control circuitry causes the voltage Vgs to vary between a turn-on value and a turn-off value, and wherein an activated series transistor acts as a low resistance when the voltage Vgs is at the turn-on value.

5. A gain-controlled amplifier circuit as set forth in claim 4, including parasitic capacitance coupled to the output of the amplifier, and wherein the low resistance provided by the activated series transistor causes the parasitic capacitance to be effectively coupled in parallel with the tuned circuit.

6. A gain-controlled amplifier circuit for a multi-band receiver, comprising:

a cascode amplifier having an output;

parasitic capacitance coupled to the output of the amplifier;

at least a first tuned circuit tuned to a first band of frequencies and a second tuned circuit tuned to a second band of frequencies;

a first series transistor coupled between the output of the amplifier and the first tuned circuit;

a second series transistor coupled between the output of the amplifier and the second tuned circuit, wherein the first and second series transistors each has a gate and a source, and wherein an activated one of the series transistors creates a series path of variable resistance between the output of the amplifier and a selected tuned circuit;

band selection circuitry coupled to the first series transistor and to the second series transistor for selectively activating one of the first and second series transistors;

a source of AGC current; and current mirror circuitry receiving the AGC current for applying a variable voltage to the gate of the activated series transistor, the variable voltage varying in response to variations in the AGC current, and wherein the activated series transistor acts as a low resistance when the variable voltage is at a low value to thereby cause the parasitic capacitance to be effectively coupled in parallel with the selected tuned circuit.

7. An amplifier circuit for a multi-band receiver, comprising:

an amplifier having an output;

at least a first tuned circuit tuned to a first band of frequencies and a second tuned circuit tuned to a second band of frequencies;

a first series transistor coupled between the output of the amplifier and the first tuned circuit;

a second series transistor coupled between the output of the amplifier and the second tuned circuit, wherein each of the series transistors has a gate, wherein an activated one of the series transistors creates a series path between the output of the amplifier and a tuned circuit, and wherein the first and second series transistors each exhibit a resistance that varies with the amplitude of a voltage received at its gate;

band selection circuitry coupled to the first series transistor and to the second series transistor for selectively activating one of the first and second series transistors;

a source of control current having at least a first maximum current level for the first band of frequencies and at least a second maximum current level for the second band of frequencies; and current mirror circuitry receiving the control current for supplying, to the gate of the activated series transistor, a voltage selected to cause the activated series transistor to exhibit a resistance that depends on the band of frequencies being received.

* * * * *